(12) United States Patent
Nie et al.

(10) Patent No.: US 11,308,882 B2
(45) Date of Patent: Apr. 19, 2022

(54) ORGANIC LIGHT-EMITTING DIODE DISPLAY PANEL AND DRIVING METHOD THEREOF

(71) Applicant: Shenzhen China Star Optoelectronics Semiconductor Display Technology Co., Ltd., Shenzhen (CN)

(72) Inventors: Chenglei Nie, Shenzhen (CN); Baixiang Han, Shenzhen (CN); Kun Cao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/496,444

(22) PCT Filed: May 27, 2019

(86) PCT No.: PCT/CN2019/088665
§ 371 (c)(1),
(2) Date: Sep. 22, 2019

(87) PCT Pub. No.: WO2020/211167
PCT Pub. Date: Oct. 22, 2020

(65) Prior Publication Data
US 2022/0028339 A1    Jan. 27, 2022

(30) Foreign Application Priority Data

Apr. 19, 2019 (CN) .......................... 201910319983.8

(51) Int. Cl.
| G09G 3/32 | (2016.01) |
| G09G 3/3258 | (2016.01) |
| H01L 27/32 | (2006.01) |

(52) U.S. Cl.
CPC ....... *G09G 3/3258* (2013.01); *H01L 27/3262* (2013.01); *G09G 2320/045* (2013.01)

(58) Field of Classification Search
CPC .. G09G 3/3258; G09G 2320/045; G09G 3/32; G09G 3/34; G09G 3/36;
(Continued)

(56) References Cited

U.S. PATENT DOCUMENTS

| 2011/0205206 A1* | 8/2011 | Yoo ...................... G09G 3/3275 345/211 |
| 2018/0144683 A1* | 5/2018 | Shin ..................... G09G 3/3233 |

(Continued)

*Primary Examiner* — Pegeman Karimi
(74) *Attorney, Agent, or Firm* — Nathan & Associates; Nathan Menachem

(57) ABSTRACT

The present disclosure provides an organic light-emitting diode (OLED) display panel and a driving method thereof. The OLED display panel includes a plurality of pixel circuits and an external compensation unit connected to the plurality of pixel circuits. The external compensation unit externally compensates the pixel circuits, obtains initial threshold voltages of driving thin-film transistors (TFTs) of each pixel circuits, obtains a sum data signal by summing up each of the initial threshold voltages and an input signal corresponding to each pixel circuits, and transmits the sum data signal to each pixel circuits. The external compensation compensates non-uniformity initial threshold voltages of each driving TFTs caused from manufacture of OLED display panel and compensates the permanent drift of the actual threshold voltage caused from external stress. The internal compensation instantly compensates relatively slight drift of actual threshold voltage occurring during the emitting of the OLED display panel.

4 Claims, 6 Drawing Sheets

(58) Field of Classification Search
CPC .. G09G 3/3233; G09G 3/3266; G09G 3/3275; G09G 2320/0233; H01L 27/3262
See application file for complete search history.

(56) References Cited

U.S. PATENT DOCUMENTS

2018/0286311 A1* 10/2018 Feng ................ G09G 3/3266
2019/0074341 A1* 3/2019 Cai ................. G09G 3/3275

* cited by examiner

ORGANIC LIGHT-EMITTING DIODE DISPLAY PANEL AND DRIVING METHOD THEREOF

FIELD OF INVENTION

The present disclosure relates to a display technology field, particularly to an organic light-emitting diode display panel and a driving method thereof.

FIELD OF INVENTION

Organic light-emitting diode (OLED) display devices have advantages such as self-illumination, low driving voltage, high luminous efficiency, short response time, high definition and high contrast ratio, near 180° viewing angles, wide temperature ranges, suitable for implementing flexible display, suitable for large area full-color display, etc. Therefore, OLED display devices are recognized as the most promising display device by the industry.

OLED devices usually include a substrate, an anode disposed on the substrate, a hole injection layer disposed on the anode, a hole transport layer disposed on the hole injection layer, and a luminance material layer disposed on the hole transport layer, an electron transport layer disposed on the luminance material layer, an electron injection layer disposed on the electron transport layer, and a cathode disposed on the electron injection layer. The luminance of OLED devices is performed by carrier injection and recombination generated from semiconductor materials and organic luminance materials which are driven by electric fields. More particular, the OLED devices generally adopt indium tin oxide (ITO) electrodes and metal electrodes as anodes and cathodes of the OLED device. When utilizing certain voltages, electrons and holes are injected from the cathodes and the anodes to the electron transport layer and the hole transport layer respectively. The electrons and holes migrate to the luminance material layer through the electron transport layer and the hole transport layer respectively. The electrons and holes meet the luminance material layer to form excitons and to active luminance molecules. The luminance molecules emit visible lights caused from radiation relaxations.

Current OLED pixel circuits are composed of two thin film transistors (TFTs) and one capacitor, which are so-called 2T1C pixel circuits. A first TFT is a switching TFT for controlling whether data signals are inputted or not. A second TFT is a driving TFT for controlling the electric currents flowing through the OLEDs. The positive or negative drift of the threshold voltage both result in display unevenness because different currents flowing through the OLEDs even the same data signal is applied. Therefore, a threshold voltage of the driving TFT (Vth) stands an important role.

Threshold voltage drift may occur in the current TFTs, which are made from low temperature polysilicon (LTPs), because of various conditions such as illumination in oxide semiconductors, voltage difference between source electrode and drain electrode, etc. As a result, the electric currents flowing through the OLEDs are inconsistent with the required currents and the uniformity of the display panel is not satisfied. The drifts of the threshold voltage in the current 2T1C circuits cannot be adjusted, so different methods are utilized to improve or eliminate the effects of threshold voltage drift. Internal compensation implements the threshold voltage compensation of the driving transistor by adding extra TFTs and signal lines in the pixel circuit.

The advantages of the internal compensation are simple compensating processes and quick operations. The disadvantages of the internal compensation are complex compensating circuit and limited compensating ability. External compensation implements the threshold voltage compensation by utilizing external driving chips to the display panel. The advantages of the external compensation are simple compensating circuit and improved compensating ability. The disadvantages of the external compensation are complex compensating processes and slow operations.

SUMMARY OF INVENTION

The objects of the present disclosure are providing an organic light-emitting diode (OLED) display panel for compensating non-uniformity initial threshold voltages of each driving thin film transistors TFTs, compensating the permanent drift of the actual threshold voltage caused from external stress. The drift of the actual threshold voltage Vth of the driving TFTs is caused from external stress, and instantly compensating relatively slight drift of actual threshold voltage occurring during the emitting of the OLED display panel.

The objects of the present disclosure are providing an OLED display panel for compensating non-uniformity initial threshold voltages of each driving TFTs, compensating the permanent drift of the actual threshold voltage caused from external stress. The drift of the actual threshold voltage Vth of the driving TFTs is caused from external stress, and instantly compensating relatively slight drift of actual threshold voltage occurring during the emitting of the OLED display panel.

To achieve the above-mentioned objects, the present disclosure provides an OLED display panel including a plurality of pixel circuits and an external compensation unit connected to the plurality of pixel circuits.

The external compensation unit is configured to externally compensate the plurality of pixel circuits, to obtain initial threshold voltages of driving thin film transistors (TFTs) of each of the plurality of pixel circuits, to obtain a sum data signal by summing up each of the initial threshold voltages and an input signal corresponding to each of the plurality of pixel circuits, and to transmit the sum data signal to each of the plurality of pixel circuits.

The pixel circuits are configured to perform internal compensations according to the sum data signal to compensate drift of threshold voltages of the driving TFTs.

The pixel circuits include a first TFT, a second TFT, a third TFT, a storage capacitor, and an OLED.

A gate of the first TFT is connected to a first node, a source of the first TFT is connected to a second node, a drain of the first TFT is configured to receive a positive voltage, and the first TFT is a driving TFT.

A gate of the second TFT is configured to receive a first control signal, a source of the second TFT is configured to receive the sum data signal, and a drain of the second TFT is connected to the first node.

A gate of the third TFT is configured to receive a second control signal, a source of the third TFT is configured to receive an initial voltage, and a drain of the third TFT is connected to the second node.

A first end of the storage capacitor is connected to the first node, and a second end of the storage capacitor is connected to the second node.

An anode of the OLED is connected to the second node, and a cathode of the OLED is configured to receive a negative voltage.

The first TFT, the second TFT, and the third TFT are N-type TFTs.

The first control signal, the second control signal, the sum data signal, and the initial voltage all sequentially correspond to an initializing step, a voltage adjusting step, a data signal inputting step, and an emitting step.

In the initializing step, a voltage potential of the first control signal is high, a voltage potential of the second control signal is high, a voltage potential of the sum data signal is equal to a voltage potential of the initial voltage, and the voltage potential of the initial voltage is low.

In the voltage adjusting step, the voltage potential of the first control signal is high, the voltage potential of the second control signal is low, the voltage potential of the sum data signal is sum of the voltage potential of the initial threshold voltage and a voltage potential of a reference voltage, the voltage potential of the initial voltage is low, and the voltage potential of the reference voltage is higher than the voltage potential of the initial voltage.

In the data signal inputting step, the voltage potential of the first control signal is high, the voltage potential of the second control signal is low, the voltage potential of the sum data signal is sum of the voltage potential of the initial threshold voltage and a voltage potential of a data signal, the voltage potential of the initial voltage is low, and the voltage potential of the data signal is higher than the voltage potential of the reference voltage.

In the emitting step, the voltage potential of the first control signal is low, the voltage potential of the second control signal is low, the voltage potential of the sum data signal is equal to the voltage potential of the initial voltage, and the voltage potential of the initial voltage is low.

The present disclosure further provides an OLED display panel driving method including the following steps.

Step S1: providing a display panel including a plurality of pixel circuits and an external compensation unit connected to the plurality of pixel circuits.

Step S2: externally compensating each of the plurality of pixel circuits, obtaining initial threshold voltages of each of driving thin film transistors (TFTs) of each of the plurality of pixel circuits, obtaining a sum data signal by summing up the initial threshold voltage and an input signal corresponding to the pixel circuit, and transmitting the sum data signals to each of the plurality of pixel circuits.

Step S3: performing internal compensations according to the sum data signals to compensate drift of threshold voltages of the driving TFTs.

The pixel circuits include a first TFT, a second TFT, a third TFT, a storage capacitor, and an OLED.

A gate of the first TFT is connected to a first node, a source of the first TFT is connected to a second node, a drain of the first TFT is configured to receive a positive voltage, the first TFT is a driving TFT.

A gate of the second TFT is configured to receive a first control signal, a source of the second TFT is configured to receive the sum data signal, and a drain of the second TFT is connected to the first node.

A gate of the third TFT is configured to receive a second control signal, s source of the third TFT is configured to receive an initial voltage, a drain of the third TFT is connected to the second node.

A first end of the storage capacitor is connected to the first node and a second end of the storage capacitor is connected to the second node.

An anode of the OLED is connected to the second node and a cathode of the OLED is configured to receive a negative voltage.

The first TFT, the second TFT and the third TFT are N-type TFTs.

In the step S3, the first control signal, the second control signal, the sum data signal, and the initial voltage all sequentially correspond to an initializing step, a voltage adjusting step, a data signal inputting step, and an emitting step.

In the initializing step, a voltage potential of the first control signal is high, a voltage potential of the second control signal is high, a voltage potential of the sum data signal is equal to a voltage potential of the initial voltage, and the voltage potential of the initial voltage is low.

In the voltage adjusting step, the voltage potential of the first control signal is high, the voltage potential of the second control signal is low, the voltage potential of the sum data signal is sum of the voltage potential of the initial threshold voltage and a voltage potential of a reference voltage, the voltage potential of the initial voltage is low, and the voltage potential of the reference voltage is higher than the voltage potential of the initial voltage.

In the data signal inputting step, the voltage potential of the first control signal is high, the voltage potential of the second control signal is low, the voltage potential of the sum data signal is sum of the voltage potential of the initial threshold voltage and a voltage potential of a data signal, the voltage potential of the initial voltage is low, and the voltage potential of the data signal is higher than the voltage potential of the reference voltage.

In the emitting step, the voltage potential of the first control signal is low, the voltage potential of the second control signal is low, the voltage potential of the sum data signal is equal to the voltage potential of the initial voltage, the voltage potential of the initial voltage is low.

The beneficial effects of the present disclosure are illustrated as following. The OLED display of the present disclosure includes a plurality of pixel circuits and an external compensation unit connected to the plurality of pixel circuits. The external compensation unit externally compensates the plurality of pixel circuits and obtains initial threshold voltages of driving TFTs of each of the plurality of pixel circuits. The external compensation unit obtains a sum data signal by summing up each of the initial threshold voltages and an input signal corresponding to each of the plurality of pixel circuits and transmits the sum data signal to each of the plurality of pixel circuits. The pixel circuits performs internal compensations according to the sum data signal to compensate drift of threshold voltages of the driving TFTs. That is, the present disclosure performs both external compensation and internal compensation. The external compensation can compensate the drift of the actual initial threshold voltage Vth1 and compensate the drift of the actual threshold voltage Vth. The drift of the actual initial threshold voltage Vth1 is caused from non-uniformity of each driving TFTs due to the manufacturing process in the OLED display panel. The permanent drift of the actual threshold voltage Vth of the driving TFTs is caused from external stress. The internal compensation can instantly compensate relatively slight drift of actual threshold voltage Vth occurs during the emitting of the OLED display panel.

DESCRIPTION OF DRAWINGS

The detailed description accompanying drawings is utilized to clarify features and technologies of the present disclosure. The drawings are only for the purpose of illustration and description and are not intended to limit the present disclosure.

DETAILED DESCRIPTION OF PREFERRED EMBODIMENTS

In order to further clarify the technical methods and effects of the present disclosure, the following detailed description is indicated with the preferred embodiments accompanying drawings of the present disclosure.

Figure 1:
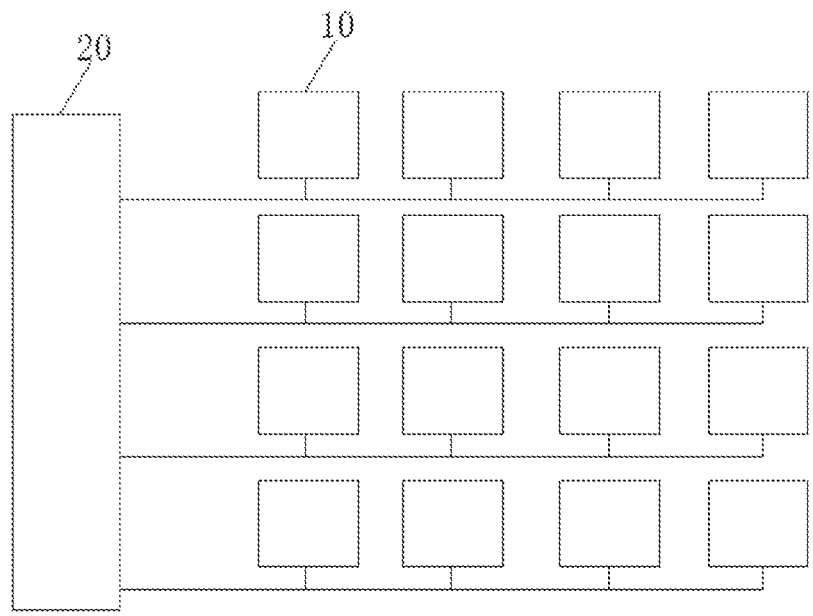
FIG. 1 illustrates an organic light-emitting diode (OLED) display panel of the present disclosure.
Figure 2:
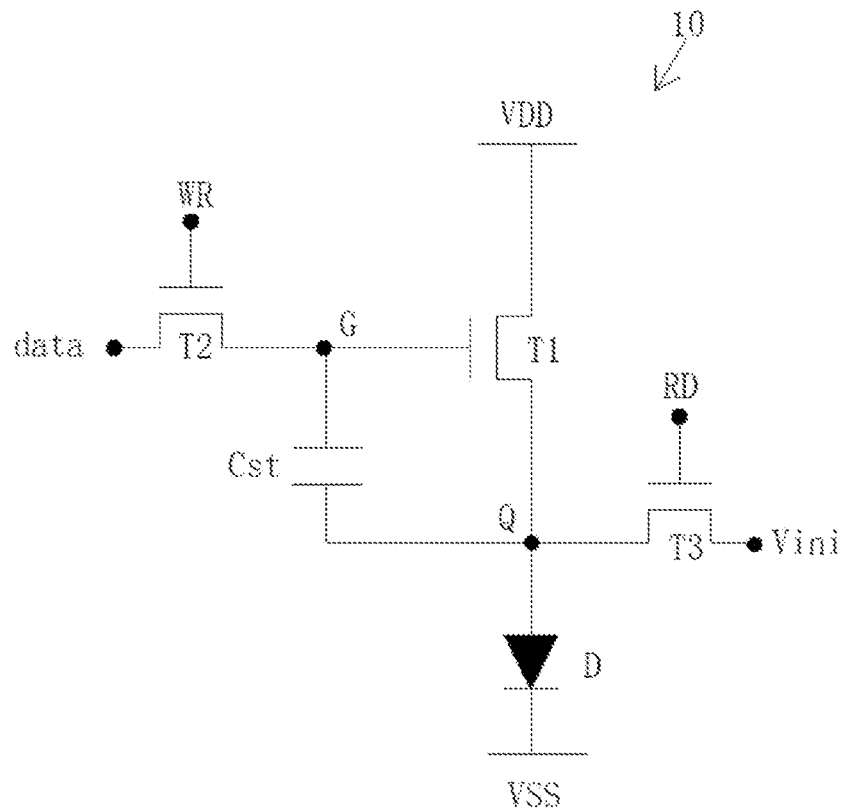
FIG. 2 illustrates a pixel circuit of the OLED display panel of the present disclosure.

Please refer to FIG. 1, the present disclosure provides an organic light-emitting diode (OLED) display panel which includes a plurality of pixel circuits 10 and an external compensation unit 20 connected to the plurality of pixel circuits 10.

The external compensation unit 20 externally compensates the plurality of pixel circuits 10 and obtains initial threshold voltages Vth1 of driving thin film transistors (TFTs) of each of the plurality of pixel circuits. The external compensation unit 20 obtains a sum data signal by summing up each of the initial threshold voltages and an input signal corresponding to each of the plurality of pixel circuits 10, and transmits the sum data signal to each of the plurality of pixel circuits 10.

The pixel circuits performs internal compensations according to the sum data signal to compensate drift of threshold voltages of the driving TFTs.

A gate of the second TFT T2 receives a first control signal WR. A source of the second TFT T2 receives the sum data signal (data). A drain of the second TFT T2 is connected to the first node G.

A gate of the third TFT T3 receives a second control signal RD. A source of the third TFT T3 receives an initial voltage Vini. A drain of the third TFT T3 is connected to the second node Q.

A first end of the storage capacitor is connected to the first node G. A second end of the storage capacitor is connected to the second node Q.

An anode of the OLED D is connected to the second node Q. A cathode of the OLED D receives a negative voltage VSS.

More specific, the first TFT T1, the second TFT T2, and the third TFT T3 are N-type TFTs.

Figure 3:
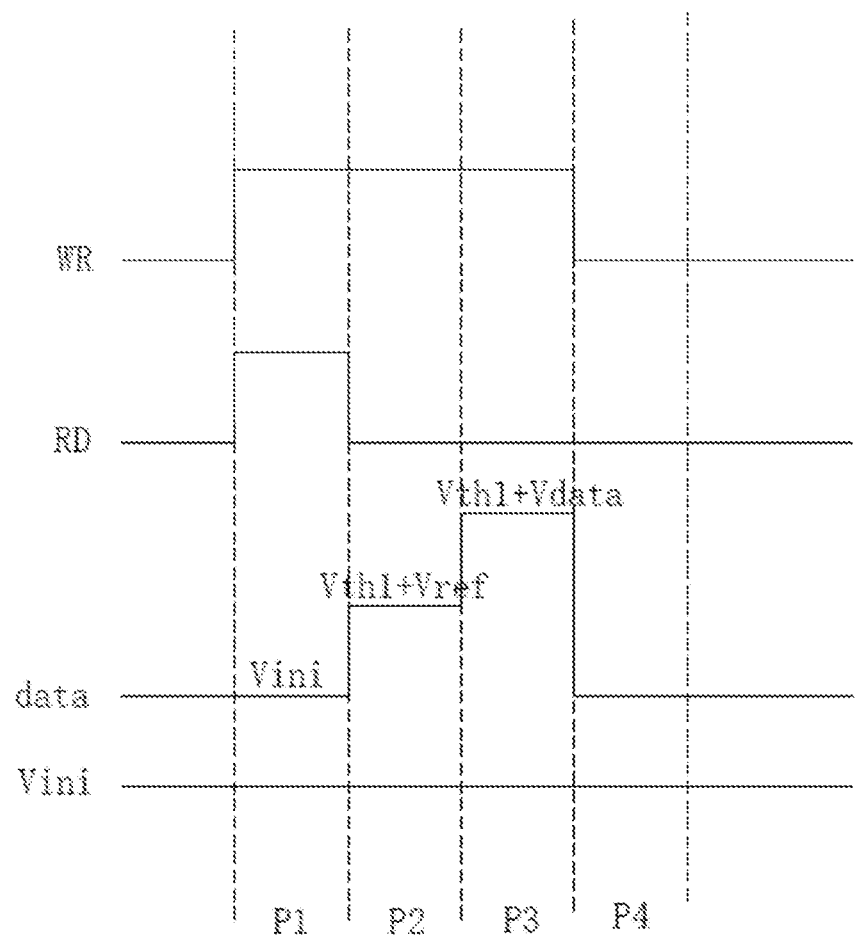
FIG. 3 illustrates signal sequences of the pixel circuit of the OLED display panel of the present disclosure.

More specific, please refer to FIG. 3. The first control signal WR, the second control signal Rd, the sum data signal (data), and the initial voltage sequentially correspond to an initializing step P1, a voltage adjusting step P2, a data signal inputting step P3, and an emitting step P4.

Figure 4:
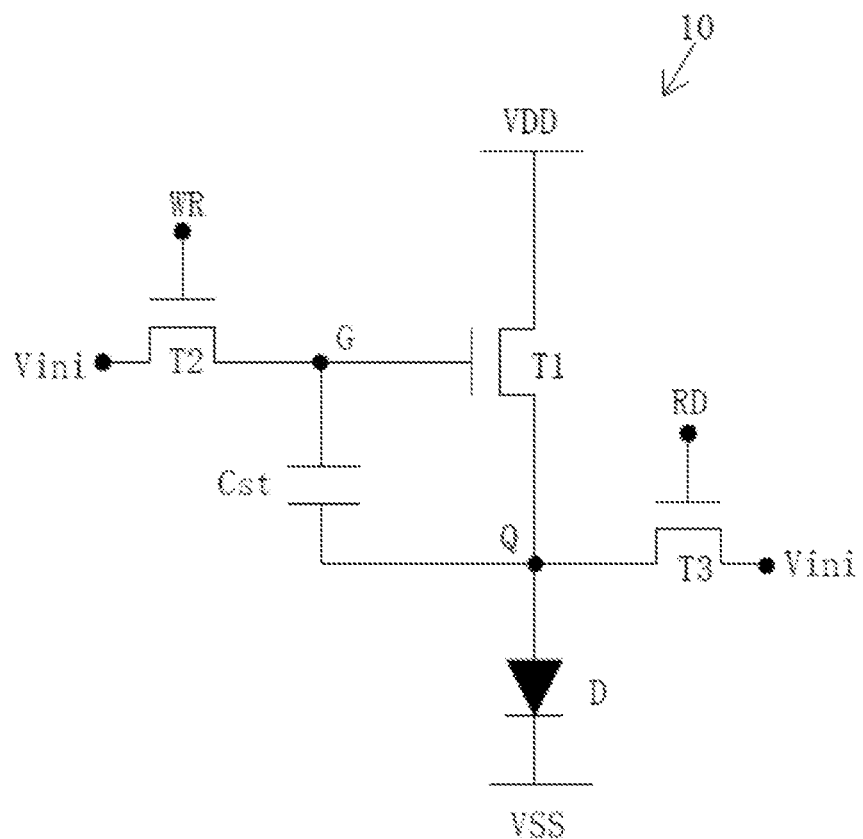
FIG. 4 illustrates an initialize step of the pixel circuit of the OLED display panel of the present disclosure.

Please refer to FIG. 4. In the initializing step P1, a voltage potential of the first control signal WR is high. A voltage potential of the second control signal RD is high. A voltage potential of the sum data signal (data) is equal to a voltage potential of the initial voltage Vini. The voltage potential of the initial voltage Vini is low.

Figure 5:
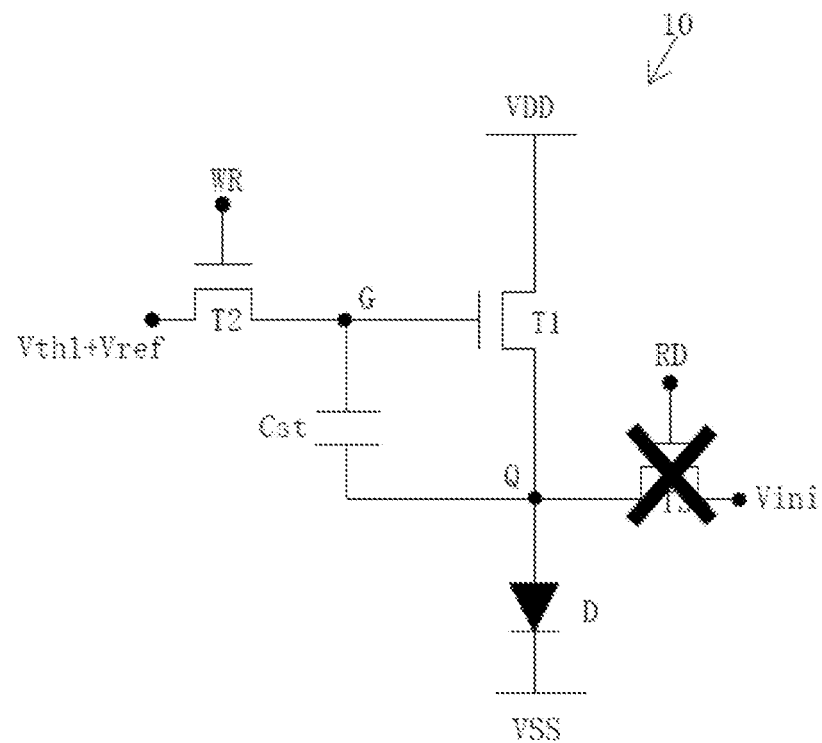
FIG. 5 illustrates a voltage adjust step of the pixel circuit of the OLED display panel of the present disclosure.

Please refer to FIG. 5. In the voltage adjusting step P2, the voltage potential of the first control signal is high WR. The voltage potential of the second control signal RD is low. The voltage potential of the sum data signal (data) is sum of the voltage potential of the initial threshold voltage Vini and a voltage potential of a reference voltage Vref. The voltage potential of the initial voltage Vini is low. The voltage potential of the reference voltage Vref is higher than the voltage potential of the initial voltage Vini. The TFT T3 is turned off and the second TFT T2 is turned on. A gate voltage of the first TFT T1 is changed from the initial voltage Vini to the sum of the initial threshold voltage Vth1 and the reference voltage Vref. A source voltage of the TFT T1 is charged from the initial voltage Vini until the source voltage becomes Vth1+Vref−Vth. Vth represents the actual threshold voltage of the driving TFT (Before the display panel emits, the initial threshold voltage Vth1 of the external compensation unit 20 for driving the TFT is the same as the actual threshold voltage Vth. Vth1 is not equal to Vth when the driving TFT is slightly affected by the temperature or voltage which result in slightly shift of Vth of the actual threshold voltage.)

Figure 6:
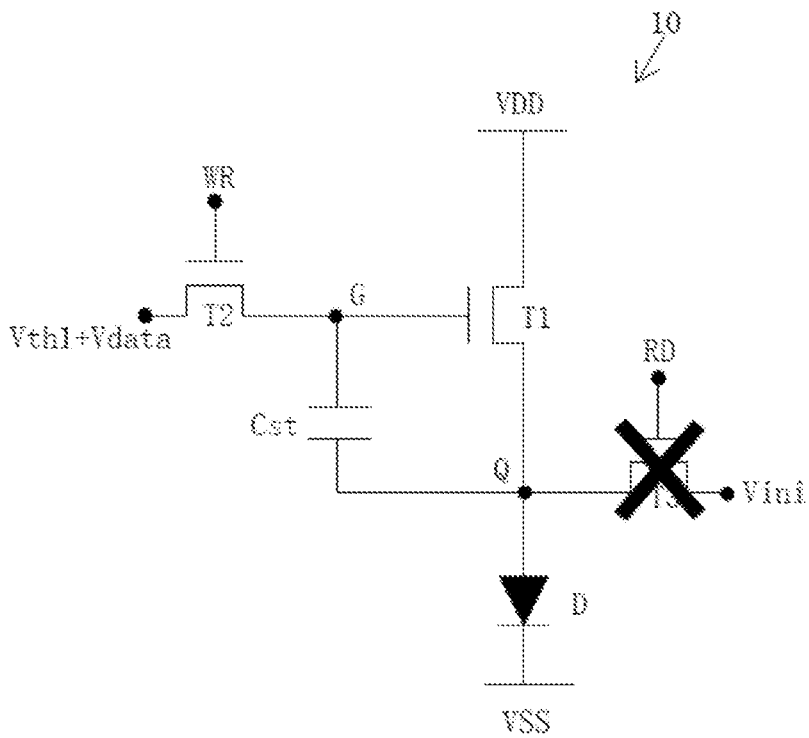
FIG. 6 illustrates a data signal input step of the pixel circuit of the OLED display panel of the present disclosure.

Please refer to FIG. 6. In the data signal inputting step P3, the voltage potential of the first control signal WR is high. The voltage potential of the second control signal RD is low. The voltage potential of the sum data signal (data) is sum of the voltage potential of the initial threshold voltage Vth1 and a voltage potential of a data signal Vdata. The voltage potential of the initial voltage Vini is low. The voltage potential of the data signal Vdata is higher than the voltage potential of the reference voltage Vref. The third TFT T3 is turned off. The second TFT T2 is turned on. The gate voltage of the first TFT T1 is changed from the sum of the initial threshold voltage Vth1 and the reference voltage Vref to the sum of the initial threshold voltage Vth1 and the data signal voltage Vdata. Thus, the variation of the gate voltage of the first TFT T1 is always Vdata−Vref. Due to the coupling induction cause by an equivalent capacitance Coled of the storage capacitor Cst and the of the OLED D, the source voltage of the first TFT T1 becomes Vref+Vth1−Vth+(Vdata−Vref)Cst/(Cst+Coled).

Figure 7:
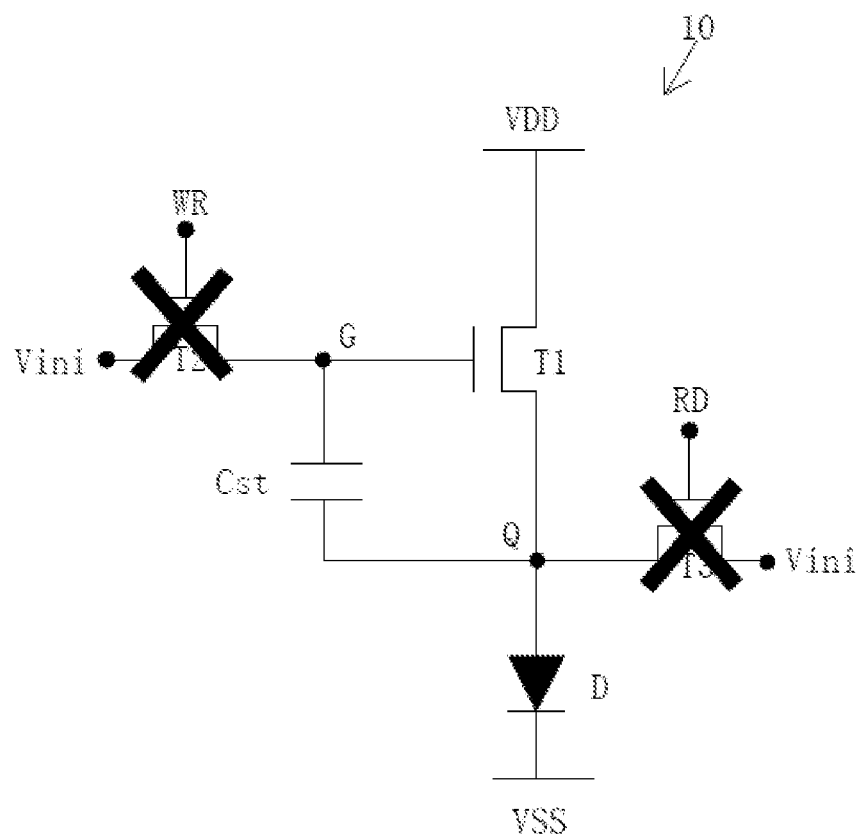
FIG. 7 illustrates a display emit step of the pixel circuit of the OLED display panel of the present disclosure.

Please refer to FIG. 7. In the emitting step P4, the voltage potential of the first control signal WR is low. The voltage potential of the second control voltage RD is low. The voltage potential of the sum data signal (data) is equal to the voltage potential of the initial voltage Vini. The voltage potential of the initial voltage Vini is low. The second TFT T2 and the third TFT T3 are both turned off. The formula of the current IOLED flowing through the OLED D is: $I_{oLED}=K \times (Vgs-Vth)^2 = K \times (Vdata+Vth1-Vref-Vth1+Vth-(Vdata-Vref)Cst/(Cst+Coled)-Vth)^2 = K \times ((Vdata-Vref)Coled/(Cst+Coled))^2$. K represents an intrinsic conduction factor of the driving TFT, i. e. an intrinsic conduction factor oft the first T TFT T1. As shown in the above formula, the current flowing through the OLED D is independent from the actual threshold voltage Vth of the first TFT T1. Therefore, the drift of the actual threshold voltage Vth of the driving TFT will not affect the OLED D so that the display brightness of the OLED display panel becomes more uniform and the display quality of the OLED display panel is improved.

The present disclosure possesses advantages of the internal compensation circuit, such as quick operation, and advantages of the external compensation circuit, such as wider compensating range. Before the OLED display panel emits, the external compensation is implemented by the external compensation unit 20 to obtain the actual initial threshold voltage Vth1 of the driving thin film transistor of each pixel unit circuit 10. During the process of driving the OLED display panel to emit, the sum data signal (data) is obtained by summing the actual initial threshold voltage Vth1 with input signals superimposing to pixel circuit 10. The sum data signal (data) is input to each of the pixel unit circuits 10 to active the internal compensation process of the pixel unit circuit 10. In the whole process, the external compensation can compensate the drift of the actual initial threshold voltage Vth1 and compensate the drift of the actual threshold voltage Vth. The drift of the actual initial threshold voltage Vth1 is caused from non-uniformity of each driving TFTs due to the manufacturing process in the OLED display panel. The permanent drift of the actual threshold voltage Vth of the driving TFTs is caused from external stress. The internal compensation can instantly compensate relatively slight drift of actual threshold voltage Vth occurs during the emitting of the OLED display panel.

For example, when the driving thin film transistors of the OLED display panel drifts ±1 V from the actual initial threshold voltage Vth, if only internal compensation is performed, an inaccuracy of the current flowing through the OLEDs D of each pixel unit circuit 10 is about 10%. Therefore, the OLED display panel will appear significant unevenness. The present disclosure can control the inaccuracy between the maximum and minimum value of the current IOLED within 2%. As a result, the uniform of the panel is greatly improved.

When the OLED display panel only performs externally compensated without internal compensation, the drifts of actual threshold voltages Vth of each of the driving thin film transistors is ±0.5 V due to temperature or voltage, an inaccuracy of the currents IOLED flowing through the OLEDs D of each pixel unit circuit 10 reaches about 25%. The present disclosure can control the inaccuracy of the maximum and minimum currents IOLED flowing through the OLED D of each pixel unit circuit 10 within 5%. As a result, the uniformity of the panel is greatly improved.

Figure 8:
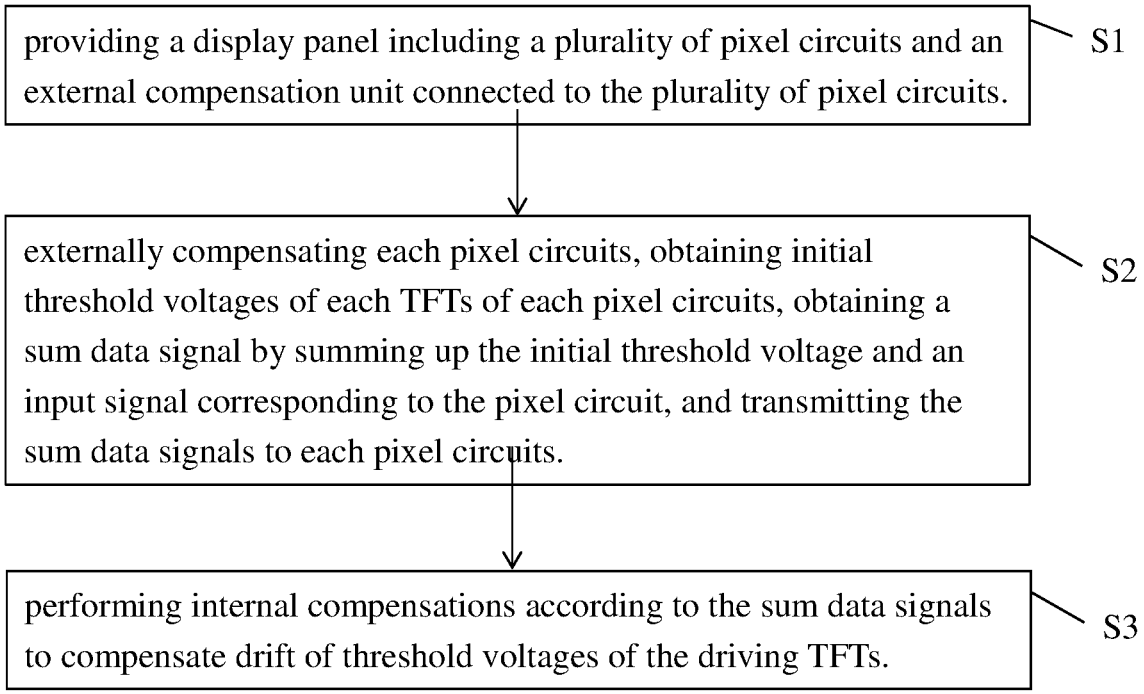
FIG. 8 illustrates a flow chart of a driving method of the OLED display panel of the present disclosure.

Please refer to FIG. 8, on the basis of the above-mentioned OLED display panel, the present disclosure further provides an OLED display panel driving method includes following steps.

Please refer to FIG. 1. Step S1 provides an OLED display panel including a plurality of pixel circuits 10 and an external compensation unit 20 connected to the plurality of pixel circuits 10.

In step S2, the external compensation unit 20 externally compensates each of the plurality of pixel circuits 10 and obtains initial threshold voltages Vth1 of each of driving TFTs of each of the plurality of pixel circuits 10. The external compensation unit 20 further obtains a sum data signal (data) by summing up the initial threshold voltage Vth1 with an input signal corresponding to the pixel circuit 10 and transmits the sum data signals (data) to each of the plurality of pixel circuits 10.

In step S3, the pixel circuits 10 performs internal compensations according to the sum data signals (data) to compensate drift of actual threshold voltages Vth.

A gate of the first TFT T1 is connected to a first node G. A source of the first TFT T1 is connected to a second node Q. A drain of the first TFT T1 receives a positive voltage VDD. The first TFT T1 is a driving TFT A gate of the second TFT T2 receives a first control signal WR. A source of the second TFT T2 receives the sum data signal (data). A drain of the second TFT T2 is connected to the first node G.

A gate of the third TFT T3 receives a second control signal RD. A source of the third TFT T3 receives an initial voltage Vini. A drain of the third TFT T3 is connected to the second node Q.

A first end of the storage capacitor is connected to the first node G. A second end of the storage capacitor is connected to the second node Q.

An anode of the OLED D is connected to the second node Q. A cathode of the OLED D receives a negative voltage VSS.

More specific, the first TFT T1, the second TFT T2, and the third TFT T3 are N-type TFTs.

More specific, please refer to FIG. 3. In the step S3, the first control signal WR, the second control signal Rd, the sum data signal (data), and the initial voltage sequentially correspond to an initializing step P1, a voltage adjusting step P2, a data signal inputting step P3, and an emitting step P4.

Please refer to FIG. 4. In the initializing step P1, a voltage potential of the first control signal WR is high. A voltage potential of the second control signal RD is high. A voltage potential of the sum data signal (data) is equal to a voltage potential of the initial voltage Vini. The voltage potential of the initial voltage Vini is low.

Please refer to FIG. 5. In the voltage adjusting step P2, the voltage potential of the first control signal is high WR. The voltage potential of the second control signal RD is low. The voltage potential of the sum data signal (data) is sum of the voltage potential of the initial threshold voltage Vini and a voltage potential of a reference voltage Vref. The voltage potential of the initial voltage Vini is low. The voltage potential of the reference voltage Vref is higher than the voltage potential of the initial voltage Vini. The TFT T3 is turned off and the second TFT T2 is turned on. A gate voltage of the first TFT T1 is changed from the initial voltage Vini to the sum of the initial threshold voltage Vth1 and the reference voltage Vref. A source voltage of the TFT T1 is charged from the initial voltage Vini until the source voltage becomes Vth1+Vref−Vth. Vth represents the actual threshold voltage of the driving TFT (Before the display panel emits, the initial threshold voltage Vth1 of the external compensation unit 20 for driving the TFT is the same as the actual threshold voltage Vth. Vth1 is not equal to Vth when the driving TFT is slightly affected by the temperature or voltage which result in slightly shift of Vth of the actual threshold voltage.)

Please refer to FIG. 6. In the data signal inputting step P3, the voltage potential of the first control signal WR is high. The voltage potential of the second control signal RD is low. The voltage potential of the sum data signal (data) is sum of the voltage potential of the initial threshold voltage Vth1 and a voltage potential of a data signal Vdata. The voltage potential of the initial voltage Vini is low. The voltage potential of the data signal Vdata is higher than the voltage potential of the reference voltage Vref. The third TFT T3 is turned off. The second TFT T2 is turned on. The gate voltage of the first TFT T1 is changed from the sum of the initial threshold voltage Vth1 and the reference voltage Vref to the sum of the initial threshold voltage Vth1 and the data signal voltage Vdata. Thus, the variation of the gate voltage of the first TFT T1 is always Vdata−Vref. Due to the coupling induction cause by an equivalent capacitance Coled of the storage capacitor Cst and the of the OLED D, the source voltage of the first TFT T1 becomes Vref+Vth1−Vth+(Vdata−Vref)Cst/(Cst+Coled).

Please refer to FIG. 7. In the emitting step P4, the voltage potential of the first control signal WR is low. The voltage potential of the second control voltage RD is low. The voltage potential of the sum data signal (data) is equal to the voltage potential of the initial voltage Vini. The voltage potential of the initial voltage Vini is low. The second TFT T2 and the third TFT T3 are both turned off. The formula of the current IOLED flowing through the OLED D is: $I_{oLED}$=K×(Vgs−Vth)$^2$=K×(Vdata+Vth1−Vref−Vth1+Vth−(Vdata−Vref)Cst/(Cst+Coled)−Vth)$^2$=K×((Vdata−Vref)Coled/(Cst+Coled))$^2$. K represents an intrinsic conduction factor of the driving TFT (i.e. an intrinsic conduction factor oft the first T TFT T1). As shown in the above formula, the current flowing through the OLED D is independent from the actual threshold voltage Vth of the first TFT T1. Therefore, the drift of the actual threshold voltage Vth of the driving TFT will not affect the OLED D so that the display brightness of the OLED display panel becomes more uniform and the display quality of the OLED display panel is improved.

The present disclosure possesses advantages of the internal compensation circuit, such as quick operation, and advantages of the external compensation circuit, such as wider compensating range. Before the OLED display panel emits, the external compensation is implemented by the external compensation unit 20 to obtain the actual initial threshold voltage Vth1 of the driving thin film transistor of each pixel unit circuit 10. During the process of driving the OLED display panel to emit, the sum data signal (data) is obtained by summing the actual initial threshold voltage Vth1 with input signals superimposing to pixel circuit 10. The sum data signal (data) is input to each of the pixel unit circuits 10 to active the internal compensation process of the pixel unit circuit 10. In the whole process, the external compensation can compensate the drift of the actual initial threshold voltage Vth1 and compensate the drift of the actual threshold voltage Vth. The drift of the actual initial threshold voltage Vth1 is caused from non-uniformity of each driving TFTs due to the manufacturing process in the OLED display panel. The permanent drift of the actual threshold voltage Vth of the driving TFTs is caused from external stress. The internal compensation can instantly compensate relatively slight drift of actual threshold voltage Vth occurs during the emitting of the OLED display panel.

For example, when the driving thin film transistors of the OLED display panel drifts ±1 V from the actual initial threshold voltage Vth, if only internal compensation is performed, an inaccuracy of the current flowing through the OLEDs D of each pixel unit circuit 10 is about 10%. Therefore, the OLED display panel will appear significant unevenness. The present disclosure can control the inaccuracy between the maximum and minimum value of the current IOLED within 2%. As a result, the uniform of the panel is greatly improved.

When the OLED display panel only performs externally compensated without internal compensation, the drifts of actual threshold voltages Vth of each of the driving thin film transistors is ±0.5 V due to temperature or voltage, an inaccuracy of the currents IOLED flowing through the OLEDs D of each pixel unit circuit 10 reaches about 25%. The present disclosure can control the inaccuracy of the maximum and minimum currents IOLED flowing through the OLED D of each pixel unit circuit 10 within 5%. As a result, the uniformity of the panel is greatly improved.

To conclude, the OLED display of the present disclosure includes a plurality of pixel circuits and an external compensation unit connected to the plurality of pixel circuits. The external compensation unit externally compensates the plurality of pixel circuits and obtains initial threshold voltages of driving TFTs of each of the plurality of pixel circuits. The external compensation unit obtains a sum data signal by summing up each of the initial threshold voltages and an input signal corresponding to each of the plurality of pixel circuits and transmits the sum data signal to each of the plurality of pixel circuits. The pixel circuits performs internal compensations according to the sum data signal to compensate drift of threshold voltages of the driving TFTs. That is, the present disclosure performs both external compensation and internal compensation. The external compensation can compensate the drift of the actual initial threshold voltage Vth1 and compensate the drift of the actual threshold voltage Vth. The drift of the actual initial threshold voltage Vth1 is caused from non-uniformity of each driving TFTs due to the manufacturing process in the OLED display panel. The permanent drift of the actual threshold voltage Vth of the driving TFTs is caused from external stress. The internal compensation can instantly compensate relatively slight drift of actual threshold voltage Vth occurs during the emitting of the OLED display panel.

Accordingly, variation or modification can be made in accordance with the technical solutions and technical concept of the present disclosure for a skilled person in the art fall in the protected scope of the present disclosure.

What is claimed is:

1. An organic light-emitting diode (OLED) display panel, comprising: a plurality of pixel circuits and an external compensation unit connected to the plurality of pixel circuits;
   wherein the external compensation unit is configured to externally compensate the plurality of pixel circuits, to obtain initial threshold voltages of driving thin film transistors (TFTs) of each of the plurality of pixel circuits, to obtain a sum data signal by summing up each of the initial threshold voltages and an input signal corresponding to each of the plurality of pixel circuits, and to transmit the sum data signal to each of the plurality of pixel circuits; and
   wherein the pixel circuits are configured to perform internal compensations according to the sum data signal to compensate drift of threshold voltages of the driving TFTs;
   wherein each of the compensation circuits comprises a first TFT, a second TFT, a third TFT, a storage capacitor, and an OLED;
   a gate of the first TFT is connected to a first node, a source of the first TFT is connected to a second node, a drain of the first TFT is configured to receive a positive voltage, and the first TFT is a driving TFT;
   a gate of the second TFT is configured to receive a first control signal, a source of the second TFT is configured to receive the sum data signal, and a drain of the second TFT is connected to the first node;
   a gate of the third TFT is configured to receive a second control signal, a source of the third TFT is configured to receive an initial voltage, and a drain of the third TFT is connected to the second node;
   a first end of the storage capacitor is connected to the first node, and a second end of the storage capacitor is connected to the second node;

an anode of the OLED is connected to the second node, and a cathode of the OLED is configured to receive a negative voltage;

wherein the first TFT, the second TFT, and the third TFT are N-type TFTs;

wherein the first control signal, the second control signal, the sum data signal, and the initial voltage all sequentially correspond to an initializing step, a voltage adjusting step, a data signal inputting step, and an emitting step.

2. The OLED display panel according to claim 1, wherein in the initializing step, a voltage potential of the first control signal is high, a voltage potential of the second control signal is high, a voltage potential of the sum data signal is equal to a voltage potential of the initial voltage, and the voltage potential of the initial voltage is low;

in the voltage adjusting step, the voltage potential of the first control signal is high, the voltage potential of the second control signal is low, the voltage potential of the sum data signal is sum of the voltage potential of the initial threshold voltage and a voltage potential of a reference voltage, the voltage potential of the initial voltage is low, and the voltage potential of the reference voltage is higher than the voltage potential of the initial voltage;

in the data signal inputting step, the voltage potential of the first control signal is high, the voltage potential of the second control signal is low, the voltage potential of the sum data signal is sum of the voltage potential of the initial threshold voltage and a voltage potential of a data signal, the voltage potential of the initial voltage is low, and the voltage potential of the data signal is higher than the voltage potential of the reference voltage;

in the emitting step, the voltage potential of the first control signal is low, the voltage potential of the second control signal is low, the voltage potential of the sum data signal is equal to the voltage potential of the initial voltage, and the voltage potential of the initial voltage is low.

3. An organic light-emitting diode OLED display panel driving method comprising:

step S1: providing a display panel comprising a plurality of pixel circuits and an external compensation unit connected to the plurality of pixel circuits;

step S2: externally compensating each of the plurality of pixel circuits, obtaining initial threshold voltages of each of driving thin film transistors (TFTs) of each of the plurality of pixel circuits, obtaining a sum data signal by summing up the initial threshold voltage and an input signal corresponding to the pixel circuit, and transmitting the sum data signals to each of the plurality of pixel circuits;

step S3: performing internal compensations according to the sum data signals to compensate drift of threshold voltages of the driving TFTs;

wherein the compensation circuits comprise a first TFT, a second TFT, a third TFT, a storage capacitor, and an OLED;

a gate of the first TFT is connected to a first node, a source of the first TFT is connected to a second node, a drain of the first TFT is configured to receive a positive voltage, the first TFT is a driving TFT;

a gate of the second TFT is configured to receive a first control signal, a source of the second TFT is configured to receive the sum data signal, a drain of the second TFT is connected to the first node;

a gate of the third TFT is configured to receive a second control signal, s source of the third TFT is configured to receive an initial voltage, a drain of the third TFT is connected to the second node;

a first end of the storage capacitor is connected to the first node, a second end of the storage capacitor is connected to the second node;

an anode of the OLED is connected to the second node, a cathode of the OLED is configured to receive a negative voltage;

wherein the first TFT, the second TFT and the third TFT are N-type TFTs;

wherein in the step S3, the first control signal, the second control signal, the sum data signal, and the initial voltage all sequentially correspond to an initializing step, a voltage adjusting step, a data signal inputting step, and an emitting step.

4. The OLED display panel driving method comprising according to claim 3, wherein in the initializing step, a voltage potential of the first control signal is high, a voltage potential of the second control signal is high, a voltage potential of the sum data signal is equal to a voltage potential of the initial voltage, and the voltage potential of the initial voltage is low;

in the voltage adjusting step, the voltage potential of the first control signal is high, the voltage potential of the second control signal is low, the voltage potential of the sum data signal is sum of the voltage potential of the initial threshold voltage and a voltage potential of a reference voltage, the voltage potential of the initial voltage is low, and the voltage potential of the reference voltage is higher than the voltage potential of the initial voltage;

in the data signal inputting step, the voltage potential of the first control signal is high, the voltage potential of the second control signal is low, the voltage potential of the sum data signal is sum of the voltage potential of the initial threshold voltage and a voltage potential of a data signal, the voltage potential of the initial voltage is low, and the voltage potential of the data signal is higher than the voltage potential of the reference voltage;

in the emitting step, the voltage potential of the first control signal is low, the voltage potential of the second control signal is low, the voltage potential of the sum data signal is equal to the voltage potential of the initial voltage, the voltage potential of the initial voltage is low.

* * * * *